United States Patent
Lopez et al.

(10) Patent No.: US 8,354,303 B2
(45) Date of Patent: Jan. 15, 2013

(54) THERMALLY ENHANCED LOW PARASITIC POWER SEMICONDUCTOR PACKAGE

(75) Inventors: Osvaldo Jorge Lopez, Annandale, NJ (US); Jonathan Almeria Noquil, Lapu Lapu (PH); Juan Alejandro Herbsommer, Schnecksville, PA (US)

(73) Assignee: Texas Instruments Incorporated, Dallas, TX (US)

( * ) Notice: Subject to any disclaimer, the term of this patent is extended or adjusted under 35 U.S.C. 154(b) by 508 days.

(21) Appl. No.: 12/569,314

(22) Filed: Sep. 29, 2009

(65) Prior Publication Data

US 2011/0074007 A1    Mar. 31, 2011

(51) Int. Cl.
*H01L 21/00*    (2006.01)
(52) U.S. Cl. ............ 438/123; 257/E21.506; 257/E21.51
(58) Field of Classification Search .................. 438/123; 257/E21.506, E21.51
See application file for complete search history.

(56) References Cited

U.S. PATENT DOCUMENTS

| | | | |
|---|---|---|---|
| 7,495,323 B2 | 2/2009 | Germain et al. | |
| 7,768,105 B2 * | 8/2010 | Cruz et al. | 257/676 |
| 8,198,139 B2 * | 6/2012 | Yang | 438/123 |
| 8,217,414 B2 * | 7/2012 | Hayashi | 257/99 |
| 2007/0132073 A1 | 6/2007 | Tiong et al. | |
| 2009/0189259 A1 * | 7/2009 | Mohamed et al. | 257/666 |
| 2009/0269885 A1 * | 10/2009 | Madrid et al. | 438/119 |
| 2009/0289275 A1 * | 11/2009 | Hayashi | 257/99 |
| 2010/0148327 A1 * | 6/2010 | Madrid | 257/670 |
| 2010/0155913 A1 * | 6/2010 | Madrid | 257/666 |
| 2012/0119343 A1 * | 5/2012 | Bayan et al. | 257/676 |

* cited by examiner

*Primary Examiner* — David Zarneke
(74) *Attorney, Agent, or Firm* — Steven A. Shaw; W. James Brady; Frederick J. Telecky, Jr.

(57) ABSTRACT

A method and structure for a dual heat dissipating semiconductor device. A method includes attaching a drain region on a first side of a die, such as a power metal oxide semiconductor field effect transistor (MOSFET) to a first leadframe subassembly. A source region and a gate region on a second side of the die are attached to a second leadframe subassembly. The first leadframe subassembly is attached to a third leadframe subassembly, then the device is encapsulated or otherwise packaged. An exposed portion of the first leadframe subassembly provides an external heat sink for the drain region, and the second leadframe subassembly provides external heat sinks for the source region and the gate region, as well as output leads for the gate region. The third leadframe subassembly provides output leads for the drain region.

12 Claims, 7 Drawing Sheets

THERMALLY ENHANCED LOW PARASITIC POWER SEMICONDUCTOR PACKAGE

FIELD OF THE INVENTION

This invention relates to the field of semiconductor devices, and more particularly to a low parasitic, dual heat dissipating semiconductor package and method for forming the package.

BACKGROUND OF THE INVENTION

During the design of packaging for semiconductor chips, various aspects such as heat dissipation and electrical performance must be considered. Devices such as power metal oxide semiconductor field effect transistors (MOSFETs) are susceptible to overheating during device operation due to high current cycling.

To reduce the impact of high thermal output during operation, dual heat dissipating package (i.e. "dual cool") assemblies have been developed. These packages can include a thermally and electrically conductive leadframe subassembly which connects to a source and gate side of the power MOSFET, and a thermally and electrically conductive bridge or clip which connects to a drain side of the power MOSFET. Portions of the leadframe and clip can remain exposed subsequent to an encapsulation process, and thereby function as heat sinks to route heat away from the functioning chip. Additionally, a the leadframe can provide output leads for the gate region, and the drain-side clip or bridge, or another conductive structure connected to the bridge or clip, can provide output leads for the drain.

Some conventional dual cool packages have the drain oriented on the top side of the package facing away from a printed circuit board (or other receiving substrate) for dissipating heat to ambient air. The formation of these devices includes the use of flip chip mounting of the semiconductor die to the leadframe. During this process, a plurality of conventional leadframes are connected in a matrix, and each semiconductor die from a singularized semiconductor wafer is removed from a wafer carrier assembly in turn, and attached to a die pad of the leadframe using a flip chip process. During the process, the die is inverted in flip chip fashion and the source region and gate region are mechanically and electrically connected to the die pad, for example using an infrared alignment system to align the die with the leadframe. Next, an individual clip or bridge is attached to the drain of the die and, depending on the device design, to other conductive structures. The bridge or clip is pre-formed (bent) to route leads to the source side of the device, or to facilitate connection with another conductive structure which will provide output leads from the drain region. A stamping process or a punch process can be used to bend or form the bridge or clip.

During the manufacture of each power MOSFET semiconductor wafer, the plurality of dice are manufactured in a source-up position. During die attach, the flip chip process requires each individual die to be removed from the wafer carrier, and then inverted for attachment to a die pad of the leadframe. The chip can be aligned with the leadframe using an infrared alignment system to position the die relative to the leadframe. Subsequently, each clip or bridge is individually handled and attached one by one to the drain sides of the dice. Conductive die attach adhesive which connects the source region and gate region to the leadframe, and which attaches the drain region to the bridge or clip, is then cured. The dice, leadframe, and clips or bridges are then encapsulated in an epoxy resin material or otherwise packaged, then separated using a singularizing process. During encapsulation, a portion of the leadframe and clip or bridge remains exposed to provide dual heat sinks, at least one for the source side and one for the drain side.

SUMMARY OF THE EMBODIMENTS

In contemplating conventional dual cool package assemblies, the inventors have realized that flip chip processing of power devices is a slow process with a low device throughput, which increases costs, and is not desirable. For example, conventional die attach methods which do not use flip chip processing can remove a die from a wafer carrier using a pick-and-place apparatus, and attach the back of the die to the leadframe pad. Throughput with a non-flip chip process using conventional equipment can be as high as 4,800 units per hour (UPH). In contrast, flip chip processing requires removal of the die from the wafer carrier, inversion of the die, then attachment of the front of the chip to the leadframe. With flip chip processing, device throughput can decrease to about 1,800 UPH, thereby requiring more than twice the equipment to produce the same number of devices. Even though flip chip processing is not desirable, conventional designs of dual cool packages require the use of flip chip processing.

The inventors have also realized that conventional dual cool designs add to the footprint of the completed device. For example, the bend in the pre-formed clip or bridge must occur at a location outside the perimeter of the die, and thus the size of the completed package will increase by an amount at least twice the horizontal run length of the bend. Additional conductive structures, if used in the device design, can further increase the size of the completed device.

Additionally, because the drain-side clip or bridge is bent to provide lead routing to the source side of the package, customizing the thickness of the drain-side structure according to operating properties of the device is difficult without retooling of manufacturing equipment. For example, the bend angle may need to be altered if the thickness of the drain-side clip is increased, the size of a slot the bridge fits in may need to be increased, or the tooling of the punch which forms the bridge may need to be changed to provide a thicker drain-side connection.

In realizing the shortcomings of conventional device designs, the inventors have developed a new semiconductor package design and method of assembly which provides dual heat dissipation and allows attachment to generally flat surfaces of both source-side and drain-side die pads while avoiding the use of a flip chip process. Thus the connection of the device to the leadframe can be performed with conventional pick-and-place equipment to increase device throughput using a pattern recognition system (PRS) to align the chip with the leadframe, which is not possible in a flip-chip process. Also, since the surfaces of both the source-side and drain-side leadframe subassemblies are generally flat across both X- and Y-directions, the thickness of the drain-side leadframe can be customized for the operating characteristics of the die. For example, a thicker drain-side leadframe subassembly can be used for higher power devices to more efficiently dissipate heat.

In one embodiment, a drain-side leadframe subassembly which is generally flat in both X- and Y-directions across a major surface is provided. A conductive die attach material such as solder paste can be dispensed on the drain-side subassembly (or on the drain region of the die), then the drain metallization of a semiconductor die such as a power MOSFET is placed onto the solder paste. Next, solder paste can be dispensed onto source and gate metallization of the die (or on the leadframe subassembly), and also onto the generally flat drain-side subassembly. A generally flat source-side leadframe subassembly, which can include separate conductive portions for the source connection and the gate connection, and a leadframe drain routing, is placed into the paste. The drain routing provides a conductive pathway from the drain region of the die to the source side of the completed device. Both the source-side and drain-side solder paste can be cured using the same cure flow, thereby preserving the thermal budget compared to serial cures, and reducing production time.

Because the drain-side leadframe subassembly is generally flat, with routings to the source side being provided by separate assemblies, the thickness of the drain-side assembly can be customized for the specific thermal and electrical requirements of the operating device.

BRIEF DESCRIPTION OF THE DRAWINGS

The accompanying drawings, which are incorporated in and constitute a part of this specification, illustrate embodiments of the disclosure and together with the description, serve to explain the principles of the disclosure. In the figures.

it should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the disclosure, a examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

A first exemplary embodiment of the disclosure is depicted in FIGS. 1-6. FIGS. 1A and 1B are perspective views depicting two sides of a single conventional semiconductor device such as a power metal oxide semiconductor field effect transistor (MOSFET) die 10. The device package can be in the style of a power quad flat no-lead (PQFN) package. A first side depicted in FIG. 1A (i.e. a "source side") 12 of the device 10 can include a source region 14 and a gate region 16. A second side depicted in FIG. 1B (i.e. a "drain side") opposite the source side 18 can include a drain region 20. The regions depicted as the source region 14, gate region 16, and drain region 20 may be metallization layers which provide access to a source, gate, and drain of the power MOSFET.

Figure 1A:
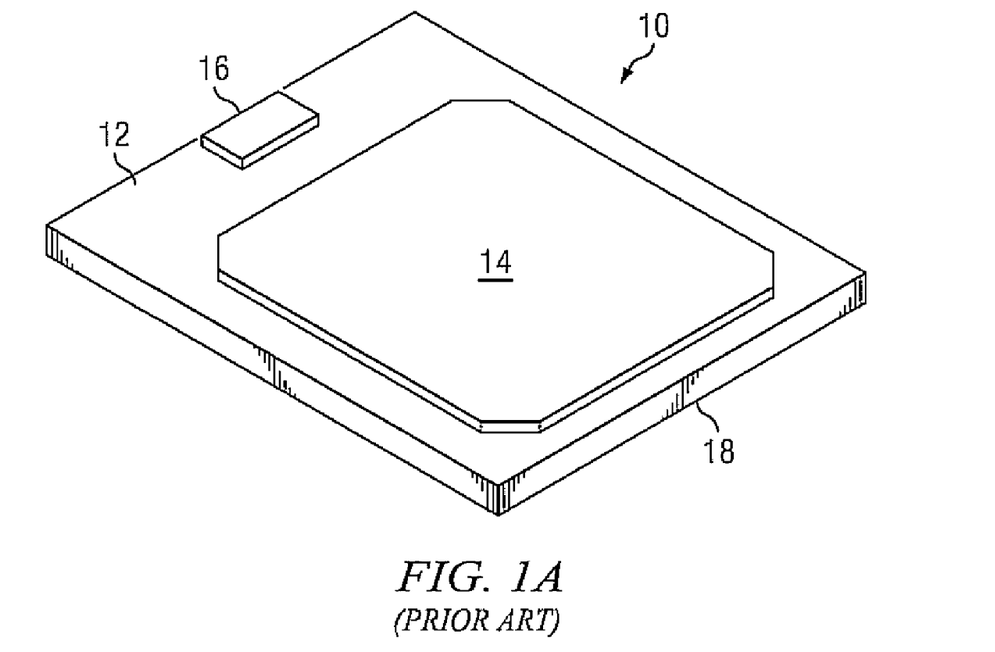
FIGS. 1A and 1B are perspective views of two sides of a single conventional power MOSFET die.
Figure 1B:
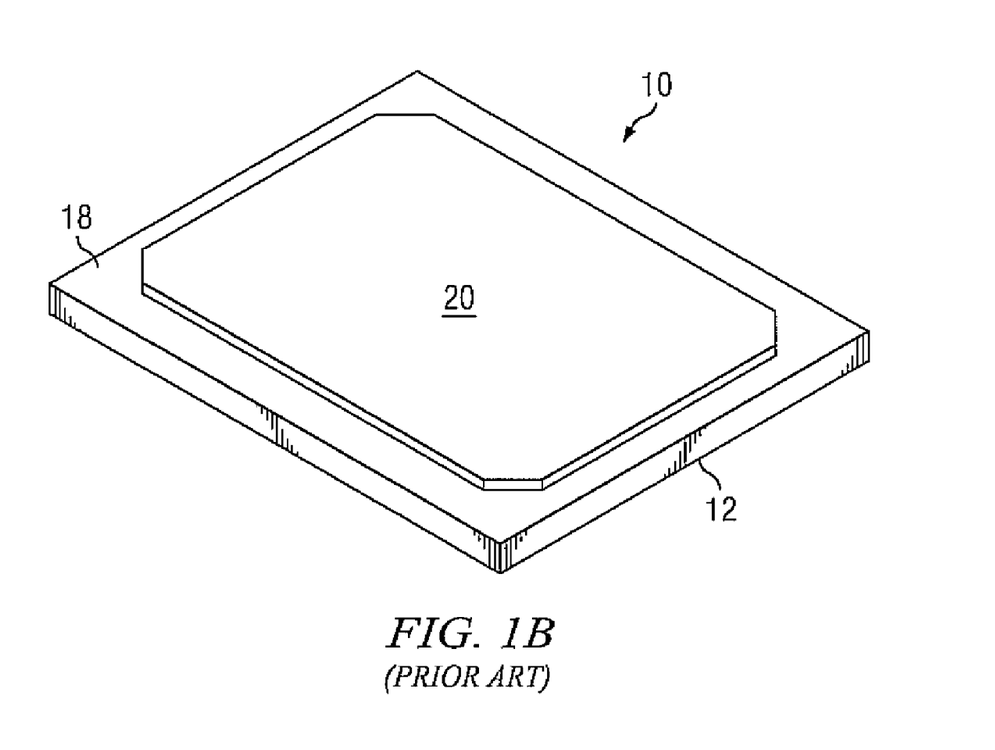
Figure 2:
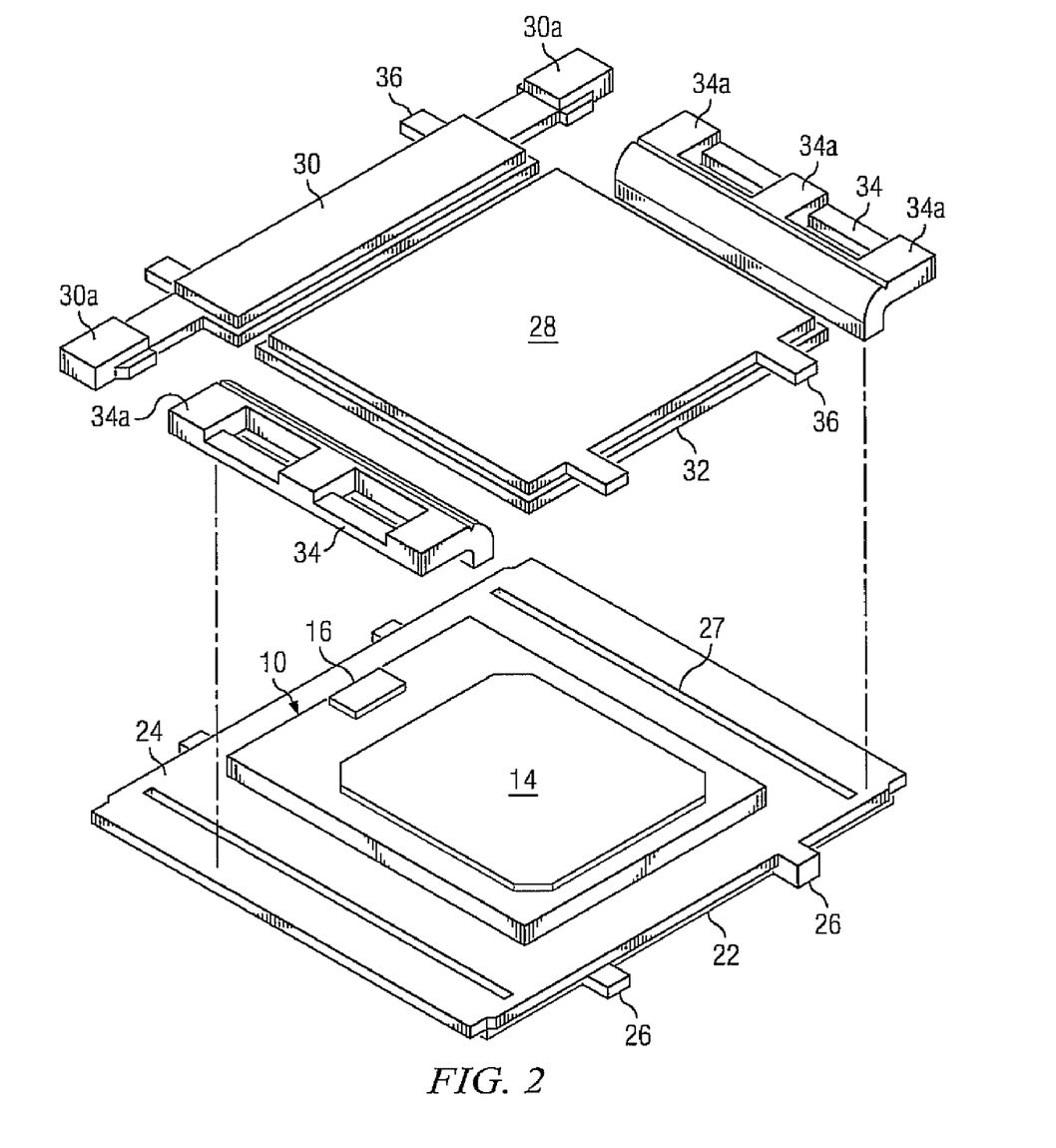
FIG. 2 is an exploded perspective view depicting various structures of a disclosed embodiment.

FIG. 2 is an exploded perspective view depicting various elements which can be present in an exemplary embodiment. In addition to the die 10 of FIGS. 1A and 1B, FIG. 2 depicts a first leadframe subassembly 22 including a major surface 24 which is electrically coupled (i.e. electrically connected) to the drain region 20 (not depicted in FIG. 2) of the die 10, for example using a conductive die attach material such as conductive epoxy, solder, etc. (not depicted). In this embodiment, the major surface 24 of the first subassembly is generally flat across X- and Y-directions.

In the present disclosure, a "generally" flat surface on a leadframe subassembly is one where contact under pressure with another generally flat surface across an entire extent of the leadframe subassembly in the X- and Y-directions does not result in a bending or misshaping of the subassembly which would prevent its use for the stated purposes disclosed herein, while maintaining a thickness of the material itself. It is evident that, with sufficient pressure, even a perfectly planar metallic structure will be deformed by decreasing the thickness of the material itself; however, this is not a practical application of this stated definition of "generally" flat for purposes of this disclosure.

To electrically couple the drain region with the generally flat major surface 24 of the first leadframe subassembly 22, and to mechanically attach the die 10 to the first leadframe subassembly, an amount of die attach adhesive is dispensed onto the first leadframe subassembly. The die can be removed from a wafer carrier, for example using a pick-and-place apparatus, and the drain region of the die is placed into the adhesive.

While a single first leadframe subassembly 22 is depicted in FIG. 2, it is to be understood that a plurality of first leadframe subassemblies can be attached in a matrix, each of which will receive an individual die and form an individual completed semiconductor device. As such, also depicted are tie bars 26 which join adjacent first subassemblies during formation of multiple devices in a matrix. Solder dams 27, which in this depiction can include a pair of recesses in the major surface 24, reduce or prevent the flow of die attach adhesive across the major surface of the first leadframe subassembly to its perimeter, which might impair attachment of the third leadframe subassembly during subsequent processing, discussed below.

FIG. 2 also depicts a second leadframe subassembly including a first portion 28 which is electrically isolated from a second portion 30. Portions 28 and 30 together form the second leadframe subassembly. The first portion 28 is electrically coupled with the source region 14, and the second portion 30 is electrically coupled with the gate region 16, using a conductive die attach material dispensed onto the source and gate regions. Both of portions 28 and 30 include a major surface 32 which is generally flat in X- and Y-directions which is electrically coupled with the source region 14 and gate region 16 respectively. In this embodiment, the second portion 30 can include gate output leads 30a which will provide an external signal path from the gate region 16 to an external surface of the completed semiconductor device.

FIG. 2 also depicts a third leadframe subassembly 34 which can be electrically coupled with the major surface 24 of the first leadframe subassembly 22, for example using a conductive die attach material. The attach material which connects the third leadframe subassembly to the first leadframe subassembly can be dispensed along with the die attach material for the second leadframe subassembly. The leadframe subassembly portions 22, 28, 30, and 34 can be manufactured using one or more of a stamping process, an etching process, etc., and can include an electrically and thermally conductive material such as metal (for example copper) or a metal alloy.

The third subassembly 34 can include output leads 34a which will provide a signal path from the drain region 14 through the first subassembly 22 to an external surface of the completed semiconductor device. In this embodiment, the third subassembly 34 is formed to facilitate electrical coupling to the first subassembly 22, and so that a surface of each output lead 34a is coplanar with a surface of the output leads 30a of the second subassembly portion 30. The third leadframe subassembly 34 is attached outside a perimeter of the die but can be attached at a location close to the die and does not add significantly to the footprint of the completed device.

FIG. 2 further depicts second leadframe subassembly tie bars 36. While only one second leadframe subassembly 28, 30 is depicted, it is to be understood that a plurality of second leadframe subassemblies can be attached in a matrix, each of which will connect with an individual die and form an individual completed semiconductor device. Tie bars 36 join adjacent second subassemblies during formation of multiple devices in a matrix.

Figure 3:
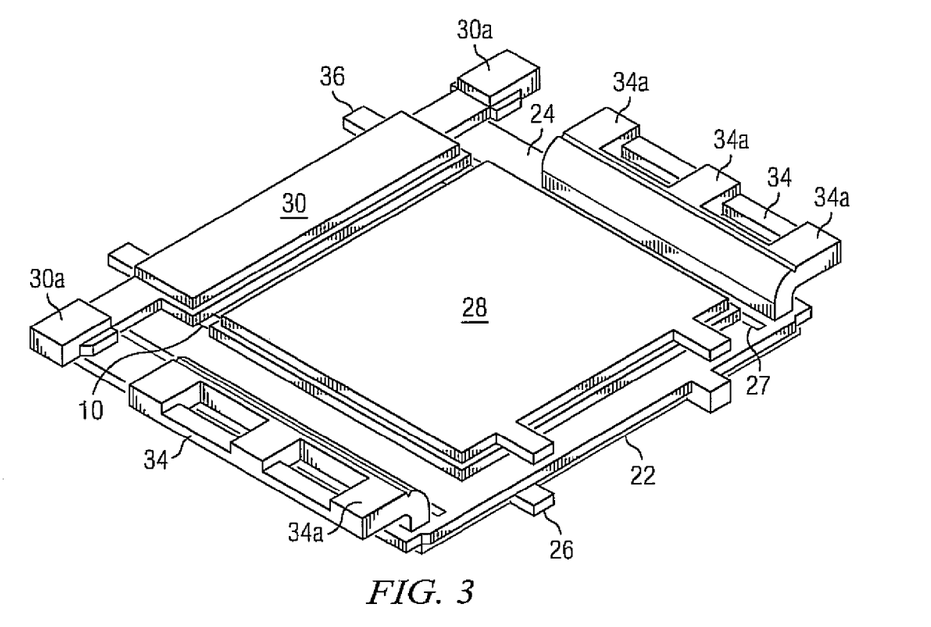
FIG. 3 is a perspective view of the FIG. 2 structure after partial assembly.

FIG. 3 depicts the FIG. 2 structure after electrically coupling the power MOSFET die 10 with the second leadframe subassembly 28, 30, and after coupling the third leadframe subassembly 34 with the first leadframe subassembly 22. After contacting the source region 14 and gate region 16 with the die attach adhesive, the die attach adhesive, including that interposed between the second assembly 28, 30 and the die 10, between the first assembly 22 and the die 10, and between the second third assembly 34 and the first assembly 22, can be flowed in a single reflow profile to minimize the thermal budget and to decrease manufacturing time.

In this embodiment, the conductive die attach material is applied to prevent electrical shorting between any of the source region 14, the gate region 16, and the third leadframe subassembly 34, but so as to enable an electrical connection between the first 22 and third 34 leadframe subassemblies. In this way, an electrical pathway is provided from the drain region 20, through the die attach material (depicted in FIG. 6 below) which connects the drain region 20 to the first subassembly 22, through the die attach material (also depicted in FIG. 6 below) which connects the first subassembly 22 to the third subassembly 34, and through the third subassembly to drain output leads 34a.

After forming a structure similar to that depicted in FIG. 3, the structure can be encapsulated or otherwise packaged according to known techniques, then each device can be separated from an adjacent device, for example using a saw. This can result in the structure of FIG. 4, which depicts encapsulation material 40 which encapsulates the die 10 and portions of the first, second, and third leadframe subassemblies. An exposed second leadframe subassembly portion 28 provides a heat sink for the source region 14, while exposed portion 30 provides a heat sink for the gate region 16. Also, structures 30a, which are formed integral with second leadframe subassembly portion 30 as depicted in FIG. 3, provide external output leads for the gate region 16. An electrical pathway from the gate region 16 to output leads 30a exterior to the device package is provided through connection of the gate region 16 with the die attach material (depicted in FIG. 6 below) and to the second leadframe subassembly portion 30.

Figure 4:
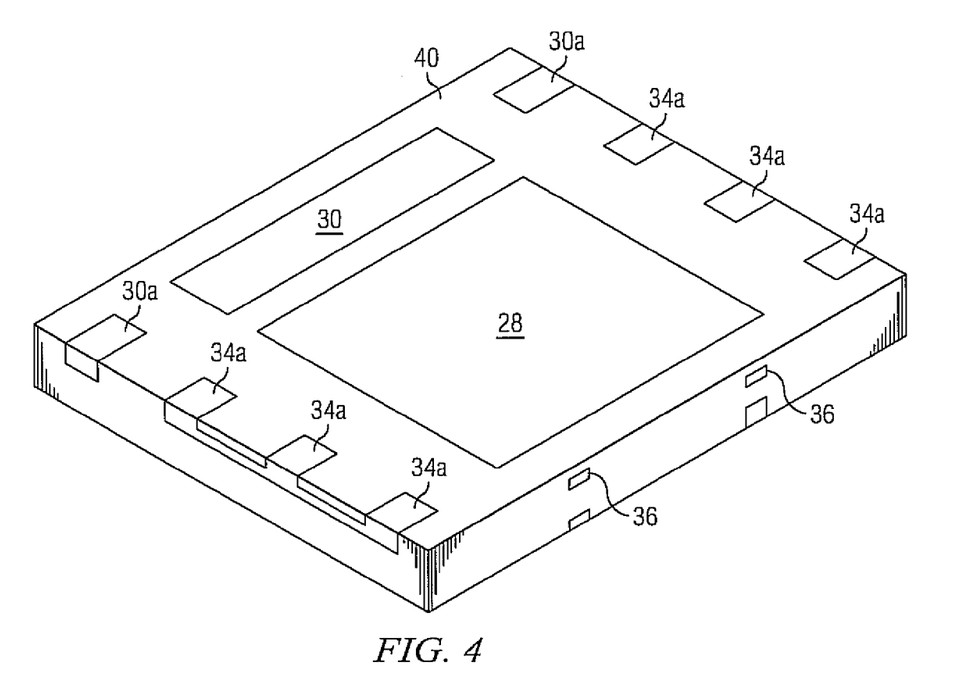
FIGS. 4 and 5 are perspective views of two sides of a device formed in accordance with one disclosed embodiment.

FIG. 4 further depicts the output leads 34a for the drain region 20 external to the device encapsulation 40. Drain region output leads 34a are provided by a portion of the third leadframe subassembly 34. The electrical pathway from the drain region 20 to the external leads 34a was previously described.

Figure 5:
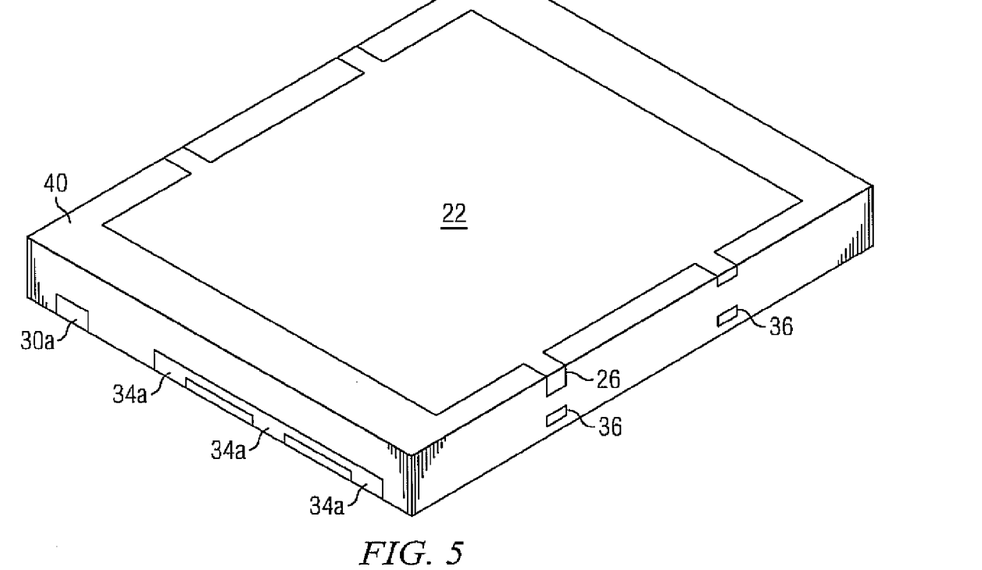

FIG. 5 depicts the opposite side of the device of FIG. 4, and can include encapsulation material 40 and first leadframe subassembly 22, which provides a heat sink for the drain region 20. FIG. 5 also depicts first and second leadframe subassembly tie bars 26 and 36, respectively. The device of FIGS. 4 and 5 is designed so the output leads external to the package are arranged such that the drain side of the device will face away from a substrate to which the device will be attached, such as a printed circuit board (PCB). This provides for maximum exposure of the drain-side first leadframe subassembly 22 to most efficiently dissipate heat from the top side of the device during operation, and provide for improved device thermal and electrical performance. However, other device designs are also contemplated, depending on the characteristics and uses of the packaged die or dice.

Figure 6:
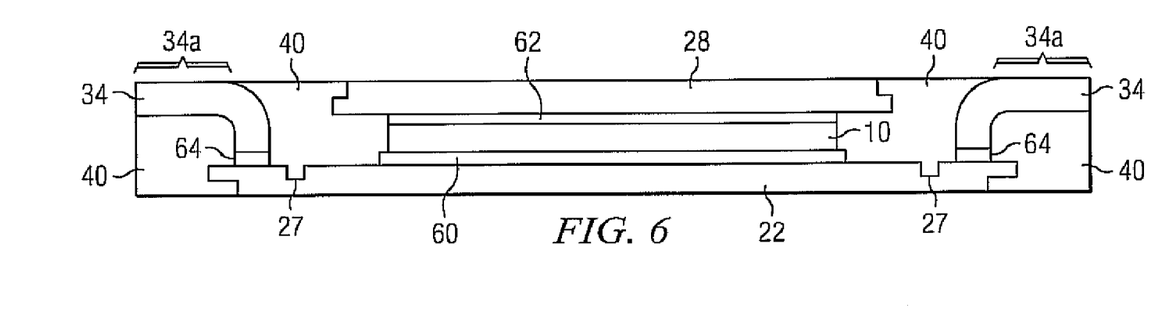
FIG. 6 is a cross section depicting an embodiment of the disclosure.

FIG. 6 is a cross section of the FIG. 5 device across the source region, the drain region, and the first 22, second 28, and third 34 leadframe subassemblies. In addition to various structures previously described, FIG. 6 depicts the conductive die attach material 60 which attaches the die 10 to the first leadframe subassembly 22 and also electrically connects the drain region 20 to the first subassembly 22. FIG. 6 further depicts the conductive die attach material 62 which attaches the die 10 to the second leadframe subassembly 28. Additionally, attach material 64 mechanically and electrically connects the third leadframe subassembly 34 to the first leadframe subassembly 22.

In the FIG. 6 cross section, the die 10 is interposed in a first direction (vertically with respect to FIG. 6) between the first leadframe subassembly 22 and the second leadframe subassembly 28. The die is also interposed in a second direction (horizontally with respect to FIG. 6) between different portions of the third leadframe subassembly 34 at left and right sides of FIG. 6. The structure provides a dual cool device having exposed heat sinks for the source region, the gate region, and the drain region of the device.

In the embodiment of FIGS. 1-6, attachment of the die to the first leadframe subassembly 22 can be performed using a conventional pick-and-place process. This electrically couples the device drain 20 to the first leadframe subassembly 22. A frame assembly including the second leadframe subassembly 28, 30 and the third leadframe subassembly 34 can then be aligned with the source region 14 and gate region 16 using a pattern recognition system (PRS) to align the second and third leadframe subassemblies with source region and gate region of the die. In contrast with prior dual heat dissipating devices, the die is connected on both sides to generally flat surfaces, which in this embodiment are flat across entire extents in the X- and Y-directions of the major surfaces of the first 22 and second 28, 30 leadframe subassemblies. In contrast, conventional drain clips or bridges are pre-formed (bent) prior to attachment to allow the output leads from the drain to be coplanar with the output leads of the gate.

Further, the drain clips or bridges of conventional dual cool devices are not attached to adjacent clips or bridges in matrix form, but are placed individually onto a semiconductor chip. The second and third leadframe subassemblies of the present embodiment can be formed in a matrix to facilitate parallel formation of multiple devices, which speeds assembly, increases device throughput, and decreases costs.

Figure 7:
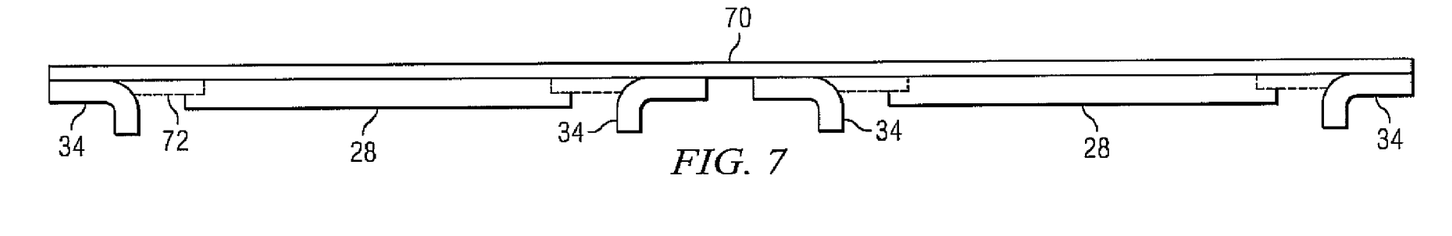
FIG. 7 is a cross section depicting an assembly including an arrangement of leadframe subassemblies which can be used with an embodiment of the disclosure.

FIG. 7 is a cross section depicting an assembly for positioning and attaching a plurality of second 28 and third 34 leadframe assemblies to a plurality of semiconductor dice, for example in a matrix. In addition to the leadframe subassemblies, FIG. 7 depicts a supporting material 70, for example a tape material, on which the second 28, 30 and third 34 leadframe subassemblies are mounted. The third leadframe subassembly 34 can be formed using a punch process, then positioned on the tape 70. Connections between the second portion of the second leadframe subassembly 30 and gate output lead 30a (see FIG. 3) are depicted in phantom at 72 to indicate their relative location in this particular implementation.

During formation of the semiconductor device, the conductive die attach material can be applied to the source and gate regions of the semiconductor dice and to the first leadframe subassembly, the tape can be positioned over a plurality of dice, then the second 28, 30 and third 34 leadframe subassemblies are placed into the attach material to complete mechanical and electrical connection of the second leadframe subassemblies with the dice, and the third leadframe subassemblies 34 with the first leadframe subassemblies 22 (FIG. 6).

In an embodiment, the design of the third leadframe subassembly 34 can be used to control the bond line thickness of the die attach adhesive 62 which connects the power die source and gate metallization to the first and second portions of the second leadframe subassembly respectively. During the attachment of the FIG. 7 assembly to the die 10 and first leadframe subassembly 22, the length of the vertical portion of the third leadframe subassembly 34 (vertical as depicted in FIG. 6) can be used to set the thickness of the die attach material 62. A longer vertical extent will allow for an increased thickness of the die attach material 62, and a shorter extent will allow for a decreased bond line thickness. The length of the vertical portion of the third leadframe subassembly thereby sets the standoff between the second leadframe subassembly 28, 30 and the first leadframe subassembly 22, which accurately controls the bond line thickness of adhesive 62. The height of subassembly 34 from the bottom to the top of 34 therefore provides a standoff or spacer for a distance between the first leadframe subassembly 22 and the second leadframe subassembly 28, 30. This standoff function of the third leadframe subassembly 34 can set the bond line thickness of die attach material 62. More accurate control of the bond line thickness can provide for a more robust and reliable device which is more forgiving to thermo-mechanical stresses than previous device designs.

Figure 8:
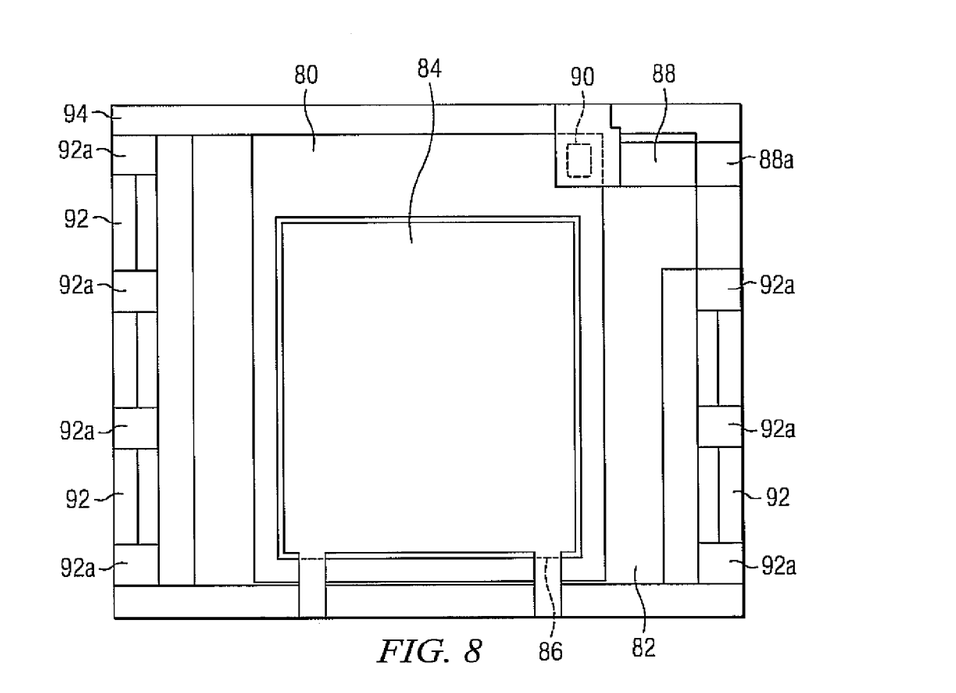
FIG. 8 is a plan view of an embodiment including two separate dice which can be used in an embodiment of the disclosure.

FIG. 8 is a plan view of an embodiment which can include the use of a package having a one gate design. This embodiment can include a semiconductor die 80, a first leadframe subassembly 82, a second leadframe subassembly including a first portion 84 which connects to a source region 86 and a second portion 88 which connects to a gate region 90. A third leadframe subassembly 92 connects to the first leadframe subassembly 82. An end 88a of the second portion 88 of the second leadframe subassembly is external to encapsulation 94 and provides an output from the gate region 90. Ends 92a of the third leadframe subassembly 90 are external to the encapsulation and provide outputs from drain region (not individually depicted). This embodiment provides one external lead 88a to the gate 90 and seven external leads 92a to the drain region. The first portion 84 of the second leadframe subassembly forms a heat sink for the source region 86, the second portion 88 provides a heat sink for the gate region 90, and the first leadframe subassembly 82 provides a heat sink for the drain region.

Figure 9:
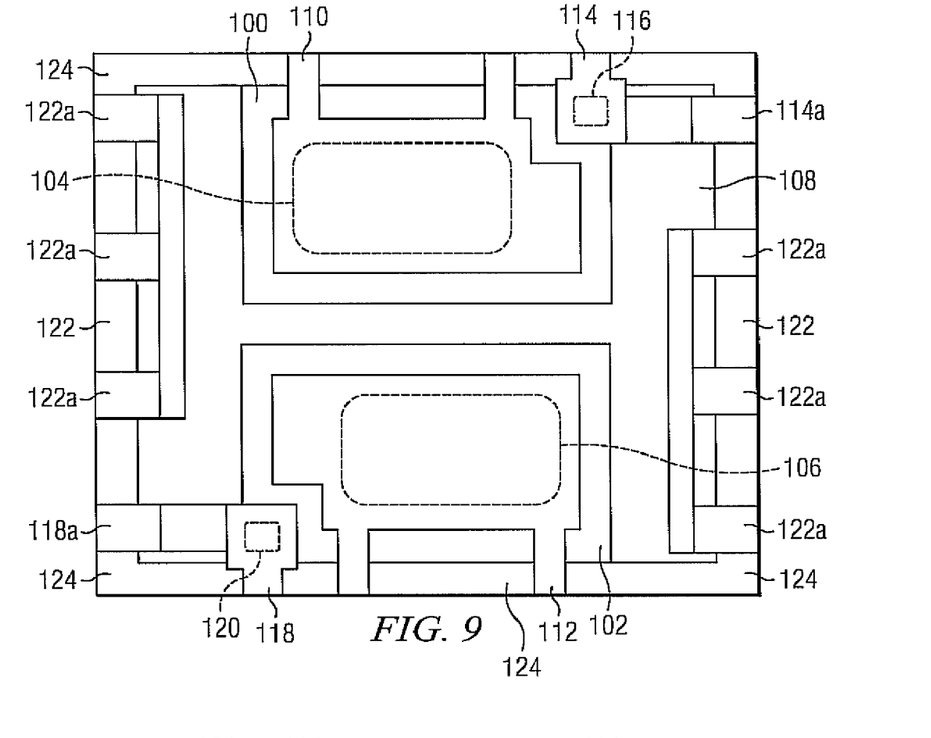
FIGS. 9-11 are plan views of a semiconductor device according to an embodiment of the present disclosure.
Figure 10:
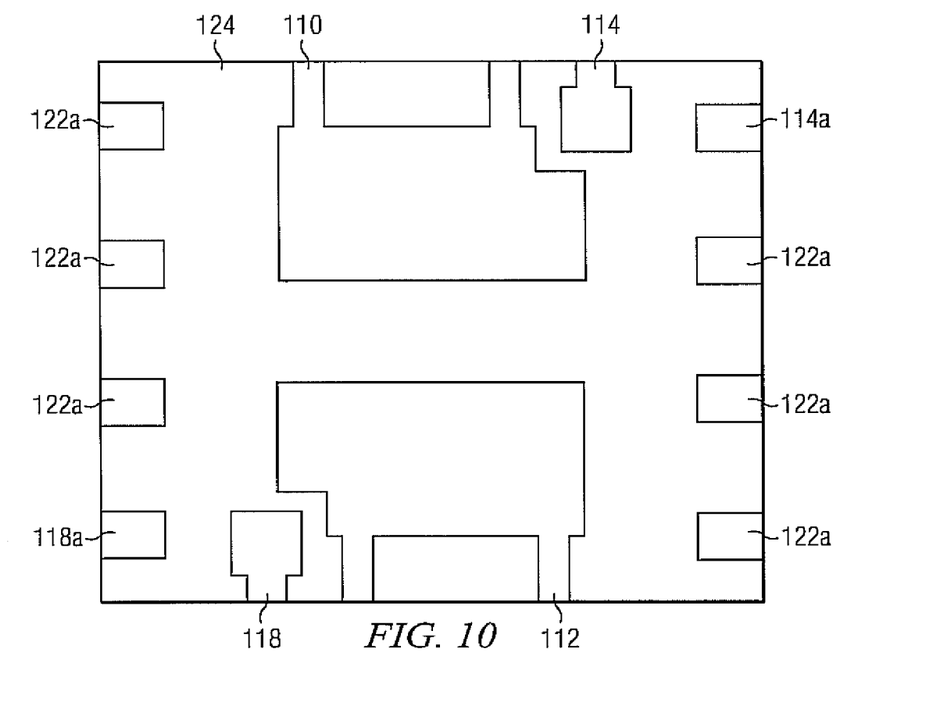
Figure 11:
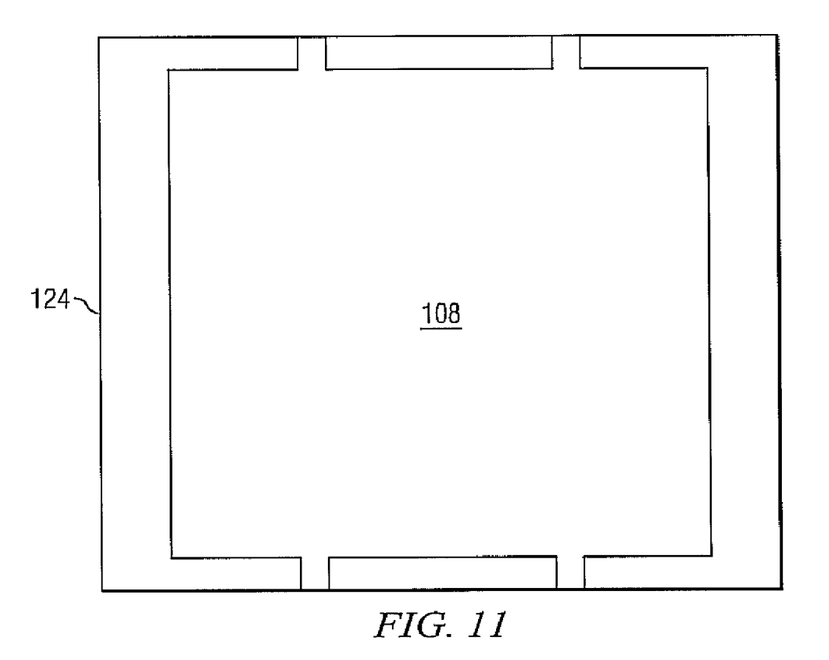

FIGS. 9-11 depict an embodiment including two separate semiconductor dice, for example a power MOSFET high-side device and a power MOSFET low-side device, encapsulated within a single package. This device design can be used to form a synchronous step-down (i.e. a "synch buck") DC to DC converter. Separating the high-side and low-side devices to individual dice reduces parasitic effects, and dissipating heat generated from the operating devices improves electrical performance and reliability.

FIG. 9 depicts a first semiconductor die 100 and a second semiconductor die 102. The depicted side of die 100, which can be a bottom side of the completed device, can include a source region 104, while the opposite side of die 100 can include a drain region (not individually depicted). The depicted side of die 102 can include a drain region 106, while the opposite side of die 102 can include a source region (not individually depicted). The opposite sides of the first die 100 and the second die 102 are electrically connected to a first leadframe subassembly 108 using a conductive die attach material, such that the drain region of the first die 100 and the source region of the second die 102 are shorted together through the first leadframe subassembly.

A second leadframe subassembly can include a first portion 110 electrically connected to the source region 104 of the first die 100, and a second portion 112 electrically connected to the drain region 106 of the second die 102, with a conductive die attach material. Second leadframe portions 110, 112 are electrically isolated from each other such that source 104 and drain 106 are electrically isolated from each other.

In this embodiment, the second leadframe subassembly also can include a third portion 114 electrically connected with a gate region 116 of the first die 100, and a fourth portion 118 electrically connected with a gate region 120 of the second die 102. The third 114 and fourth 118 portions can provide external outputs to the first die gate region 116 and the second die gate region 120 respectively.

A third leadframe subassembly 122 electrically connects with the first leadframe subassembly 108, for example using a conductive die attach adhesive, to provide output leads for the electrically shorted drain region of die 100 and the source region of die 102.

After assembling the first 100 and second 102 dice with the first 108, second 110, 112, and third 122 leadframe subassemblies, the device can encased in encapsulation material 124 or otherwise packaged, then separated from adjacent devices (not depicted) simultaneously formed as part of a matrix. After packaging, a gate output lead 114a from the gate 116 of the first die 100, a gate output lead 118a from the gate 120 of the second die, and source/drain output leads 122a from the drain of the first die 100 and the source of the second die 102 remain on an external surface of the encapsulated device.

Because the source side of the first die and the drain side of the second die are attached to second leadframe portions which are electrically isolated from each other, a single semiconductor device can be formed which has a low parasitic characteristic.

FIGS. 10 and 11 depict the FIG. 9 structures which are visible on the external surface of the package after encapsulation. The FIG. 10 structure is the same view as the FIG. 9 structure, which can be the bottom of the device which is attached to a receiving substrate such as a printed circuit board. The FIG. 11 structure is a plan view of the top of the device, and can include the first leadframe subassembly 108 which provides a heat sink for the electrically shorted first die 100 drain region and second die 102 source region.

Figure 12:
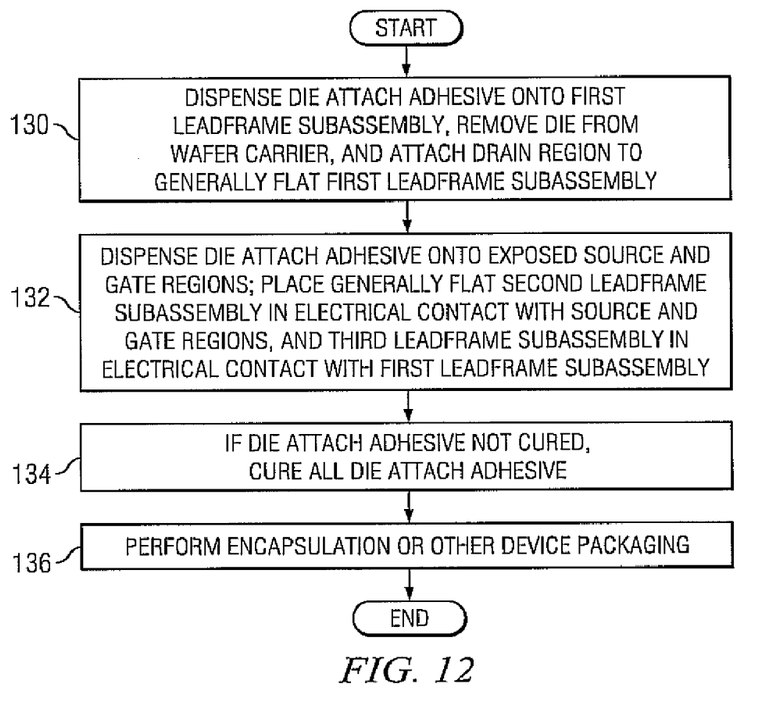
FIG. 12 is a flow chart depicting an embodiment of the disclosure.

FIG. 12 is a flow chart depicting an embodiment of the disclosure. Various modifications can be made as will be recognized by one of ordinary skill.

The process starts, and die attach adhesive is dispensed onto a first leadframe subassembly. The drain region of a die such as a power MOSFET device is attached to the generally flat first leadframe subassembly using a conductive die attach adhesive 130. During the attachment, the die can be removed from a wafer carrier using a conventional pick-and-place process, and attached to the first leadframe subassembly. The die attach adhesive can be cured at this point, or all die attach adhesives used in the present process can be cured in a single reflow during subsequent processing.

Next, conductive adhesive is dispensed onto the exposed source region, gate region, and first leadframe subassembly 132. The second and third leadframe subassemblies are aligned with the source region, gate region, and first leadframe subassembly, for example using a PRS system, then placed into electrical contact with the source region, gate region, and first leadframe subassembly.

If the die attach adhesive has not yet been cured, all previously dispensed die attach material can be cured using a single curing process 134. Performing all cures simultaneously can reduce the thermal budget and reduce processing time. Any material such as tape 70 previously described which positions the various subassemblies can be removed.

Next, the die and portions of the first, second, and third leadframe subassemblies are encapsulated or otherwise packaged 136. The present process ends and subsequent processing, such as singularizing connected devices formed as a matrix, can occur according to techniques known in the art.

Thus various embodiments of the present disclosure can provide a dual cool structure and method which has advantage over prior dual heat dissipating structures and methods.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for forming a semiconductor device, comprising:
    electrically coupling a drain metallization on a first side of a semiconductor die to a first leadframe subassembly;
    electrically coupling a source metallization on a second side of the semiconductor die to a second leadframe subassembly using a non-flip chip process; and
    electrically coupling the first leadframe subassembly to a third leadframe subassembly, wherein the third leadframe subassembly is electrically coupled with the drain metallization.

2. The method of claim 1, wherein the electrically coupling of the source metallization to the second leadframe subassembly and electrically coupling the first leadframe subassembly to the third leadframe subassembly are preformed simultaneously during a single attachment.

3. The method of claim 1, further comprising:
    during the electrical coupling of the source metallization to the second leadframe subassembly, attaching the source metallization to a first portion of the second leadframe subassembly; and
    electrically coupling a gate metallization on the second side of the semiconductor die to a second portion of the second leadframe subassembly, wherein the first portion and the second portion of the second leadframe subassembly are electrically isolated from each other during device operation.

4. The method of claim 3, further comprising:
    encapsulating the semiconductor die and portions of the first, second, and third leadframe subassemblies; and
    during the encapsulating, exposing the second portion of the second leadframe subassembly to provide package output leads from the gate metallization.

5. The method of claim 4, further comprising exposing the third leadframe subassembly during the encapsulation to provide package output leads from the drain metallization.

6. The method of claim 5, further comprising providing a conductive pathway from the drain metallization, to a first conductive adhesive, to the first leadframe subassembly, to a second conductive adhesive, to the third leadframe subassembly, and to an external device package location.

7. The method of claim 6 wherein both the first leadframe subassembly and the second leadframe subassembly are generally flat.

8. A method for forming a semiconductor device, comprising:
    providing a power metal oxide semiconductor field effect transistor (MOSFET) semiconductor die comprising a first major surface having a drain region and a second major surface opposite the first major surface having a source region and a gate region;
    attaching the first major surface to a first leadframe subassembly, wherein the first leadframe subassembly is generally flat across an X-direction and a Y-direction;

attaching the second major surface to a second leadframe subassembly which is generally flat across an X-direction and a Y-direction; and electrically coupling the first leadframe subassembly to a third leadframe subassembly wherein, subsequent to the electrically coupling, the third leadframe subassembly has a portion coplanar with the second leadframe subassembly.

9. The method of claim 8, wherein the second leadframe subassembly comprises a first portion electrically isolated from a second portion, and the attachment of the second major surface to the second leadframe subassembly further comprises:

attaching the first portion of the second subassembly to the source region; and attaching the second portion of the second subassembly to the gate region.

10. The method of claim 8, further comprising electrically coupling the first leadframe subassembly to the third leadframe subassembly using a conductive paste.

11. The method of claim 8, further comprising:

encapsulating the die, the first leadframe subassembly, the second leadframe subassembly, and the third leadframe subassembly wherein, subsequent to encapsulating the die:

an exposed surface of the first leadframe subassembly provides a heat sink for the drain region;

a first exposed surface of the second leadframe subassembly provides a heat sink for the source region; and a second exposed surface of the second leadframe subassembly provides a heat sink for the gate region.

12. The method of claim 11 further comprising, during the encapsulating of the die:

leaving at least one surface of the third leadframe subassembly exposed to provide package output leads from the drain region; and leaving at least one surface of the second leadframe subassembly exposed to provide package output leads from the gate region.

* * * * *